United States Patent [19]

Huft

[11] Patent Number: 4,572,927
[45] Date of Patent: Feb. 25, 1986

[54] CURRENT LIMITER FOR TELEPHONE OFFICE SIGNALLING

[75] Inventor: John M. Huft, Golden, Colo.

[73] Assignee: GTE Communication Systems Corporation, Phoenix, Ariz.

[21] Appl. No.: 473,484

[22] Filed: Mar. 9, 1983

[51] Int. Cl.$^4$ .................. H03K 17/64; H04M 3/00
[52] U.S. Cl. .................. 179/16 AA; 179/18 AH; 307/255; 307/296 R; 361/152
[58] Field of Search .............. 361/152, 154; 307/255, 307/296 R; 179/16 A, 16 AA, 81 R, 16 F, 18 FA, 70, 77, 18 AH

[56] References Cited

U.S. PATENT DOCUMENTS

| | | | |
|---|---|---|---|
| 3,123,746 | 3/1964 | Wachowiak | 361/154 |
| 3,582,718 | 6/1971 | Spellman | 361/154 |
| 4,119,869 | 10/1978 | Hashimoto | 307/296 R |
| 4,224,654 | 9/1980 | Golthrop et al. | 361/152 |
| 4,305,010 | 12/1981 | Wise | 307/255 |
| 4,323,733 | 4/1982 | Ott et al. | 179/6.3 R |
| 4,325,019 | 4/1982 | Tezuka | 323/315 |
| 4,384,716 | 5/1983 | Powers | 273/121 A |

FOREIGN PATENT DOCUMENTS

| | | | |
|---|---|---|---|
| 1271242 | 6/1968 | Fed. Rep. of Germany | 307/255 |
| 2854248 | 1/1980 | Fed. Rep. of Germany | 361/152 |
| 0020727 | 2/1977 | Japan | 361/152 |

Primary Examiner—Keith E. George
Assistant Examiner—R. Vaas
Attorney, Agent, or Firm—Russell A. Cannon

[57] ABSTRACT

A ring-ground circuit in a telephone system comprises a control transistor that selectively receives base drive from a microprocessor and that has its emitter connected through a low voltage LED and through the series combination of the base-emitter junction of a switching transistor and its emitter resistor to ground. The LED has a sharp transition in its conduction characteristics when the voltage across it reaches a predetermined value which is a reference voltage. Conduction of the control transistor provides base drive to the switching transistor for causing collector current in the latter to initiate a ground-start condition in a relay coil that is connected to a central office battery voltage. When current in the switching transistor increases to a prescribed value, that is set by the LED reference voltage and the emitter resistor, conduction of the switching transistor is automatically controlled for limiting the maximum value of its collector current.

3 Claims, 2 Drawing Figures

CURRENT LIMITER FOR TELEPHONE OFFICE SIGNALLING

BACKGROUND OF INVENTION

This invention relates to current limiter circuits and more particularly to a current limiter that is used in a telephone signalling circuit, e.g., a ring-ground circuit, and it supplies a ground-start signal.

Current limiting, when it was employed, generally consisted of a pair of equal valued series resistors connected in each leg of a telephone circuit. Thus the maximum current drain that could be obtained from the standard −50 volt central office battery was limited by the value of these resistors and the resistance of the connected signalling circuit. In this case, without a current limiter, a switching transistor that is enabled by and receives its base drive from the signalling circuit provides a ground via its emitter-collector path to supply a ground-start signal. Since the collector current of the switching transistor may be considerable in a short loop, a large and expensive high power transistor is required here. This function has also been accomplished with a relay which is even larger, requires more power, and is more expensive.

With the advent of sophisticated control devices in the form of microprocessors, the time-honored signal functions could be readily derived in a very low power miniaturized device. However, it is necessary in the telephone industry to make sure that the new is compatible with the old, thus assuring the integrity of the system.

SUMMARY OF THE INVENTION

In a telephone signalling circuit which is microprocessor controlled, an interface circuit provides the necessary level shifting required between the microprocessor output control voltage and a switching transistor, and is activated when a particular signalling function is to be performed. Switching means having current limiting associated therewith operates in coordination with the interface circuit to restrict current that is provided to perform the signalling function to a predetermined value.

DESCRIPTION OF PREFERRED EMBODIMENTS

Figure 1:
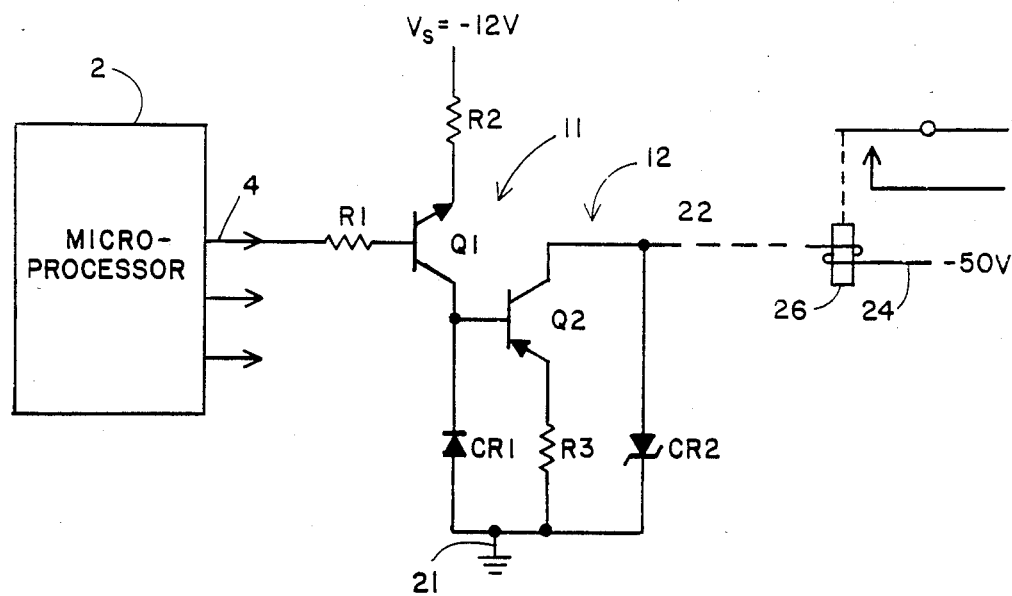
FIG. 1 is a schematic diagram showing the interconnection of the level shifter 11 with the microprocessor 2 and the switching and current limiter 12.

Referring now to FIG. 1, the circuits 11 and 12 that are connected to the microprocessor 2 comprise a ring-ground circuit that is designed to supply on line 22 a ground-start signal current, e.g., in a foreign exchange office (FXO), for ground-start operation. As noted hereinabove, the use of a microprocessor 2 allows for a considerable reduction in both the size and power consumption required for the ring-ground circuit. To take full advantage of this, a current limit requirement is set so that smaller components such as transistor Q2 can be employed. Q2 provides the ground-start switching function and thus must operate between the −50 volt central office battery voltage on line 24 and ground. A single heavy duty transistor could be employed, but such an arrangement is impractical, being large and expensive, and undesirable where using a microprocessor is contemplated. To illustrate the situation that could exist with a single transistor Q2 here, it is necessary to understand that the resistor R3 would then not be employed. The loop resistance connected in series with the Q2 collector and emitter, i.e., between ground and the −50 volt office battery, could be in the order of 200 ohms or less which would provide a current of 250 milliamperes or more. Thus the power requirement becomes significant and it is desirable to reduce it to the greatest extent possible.

Microprocessor 2 is programmed to identify various circuit conditions and to provide control signal output voltages in response thereto in a well-known manner. Of interest here is the control signal on line 4 which initiates ground-start operation. This control signal is applied on path 4 to a level shifter circuit 11 comprising resistor R1, transistor Q1 and resistor R2. The level shifter is connected to the switching and current limiting circuit 12 comprising switching transistor Q2, emitter resistor R3 and diode CR1. The function of the level shifter is to provide an interface between the microprocessor and the central office battery voltage that is connected to the other side of the ring-ground switch and more particularly to insure that Q2 is cut off when the control voltage on line 4 does not call for ground-start operation.

Figure 2:
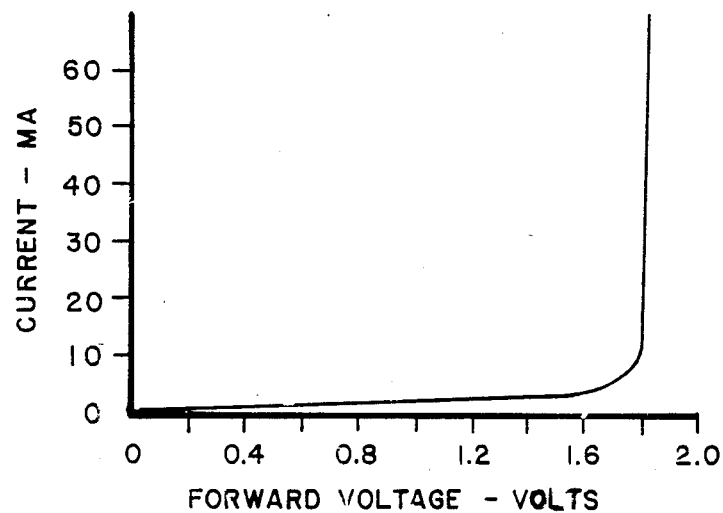
FIG. 2 is a current-voltage characteristic of a light emitting diode CR1 employed in a preferred embodiment of the invention.

When Q1 is enabled by the output voltage on line 4, it draws conduction current through CR1 and base current through R3 and Q2 for turning on the switching transistor Q2 which closes the circuit between the −50 volt central office battery and the office ground line 21. The diode CR1 is a green light emitting diode such as a model SPG 5531 manufactured by Stanley and has a very sharp knee or transition in its current-voltage characteristic, at about 1.8 volts. A typical current-voltage characteristic for such a diode is shown in FIG. 2. The diode CR1 is connected in parallel with the series combination of the Q2 base-emitter junction and resistor R3. As is well-known, the base-emitter junction diode breakdown voltage of a transistor such as Q2 is in the order of 0.6 volts. Thus, when the voltage across R3 increases to 1.2 volts, the voltage across CR1 is 1.8 volts. Reference to the current-voltage characteristic in FIG. 2 shows that the current passing through CR1 can increase but there is very little change in voltage across it. This means that a 1.8 volt reference level is established on the Q2 base which causes Q2 to cut off when the voltage across R3 and the Q2 base-emitter junction exceeds 1.8 volts. In this manner the maximum collector current in Q2 is limited to a prescribed value. The limiting value of Q2 collector current is derived by dividing the 1.2 volts by the resistance of R3. Thus, the current limit point is established by setting the value of R3. For example, if R3 is 34 ohms, then the maximum current in Q2, and thus through the ground-start circuit is approximately 35 milliamperes. Thus, an effective current limit is obtained and low power components may be employed here. The breakdown diode CR2, which may be a Zener diode, protects Q2 from overvoltages such as may be induced by lightning.

Stated differently, the operation of the ground-start circuit is believed to be as follows. With the microprocessor control voltage on line 4 turning on Q1, the Q1 collector current is established by R2 and flows primarily through the LED, which establishes a 1.8 volt reference level on the Q2 base, with some current also being drawn through the Q2 base for turning the latter. The resultant Q2 collector current provides the ground-start current in relay coil 26. In this circuit, the Q2 base voltage must be 0.6 volt more negative than its emitter to maintain Q2 conducting. As the Q2 emitter current in R3 increases, then the Q2 emitter voltage drops. And when it drops below 1.2 volts, then Q2 tries to turn off. Since the CR1 voltage is substantially constant at 1.8 volts, the circuit 12 will then establish an equilibrium point of operation where the R3 voltage is substantially 1.2 volts and the Q2 base-emitter voltage is substantially 0.6 volt, this condition being set up by the maximum conduction level of the LED CR1. Thus, Q2 and R3 may be thought of as being self limiting, since Q2 turns itself off when there is too much collector current flowing through it. This means that Q2 is driven by the voltage drop across the LED, and when R3 and the Q2 base-emitter junction have too much voltage across them, i.e., greater than the 1.8 volts that is across CR1, they shut Q2 off, because Q2 no longer has any base drive. The LED provides the low reference voltage which establishes where the limiting is to occur.

Although this invention is described in relation to preferred embodiments thereof, variations and modifications will occur to those skilled in the art. By way of example, a semiconductor diode or diode connected transistor may be connected in series with CR1 for temperature tracking Q2. The current limit is then 1.8 volts divided by R3. And Q1 and Q2 may be of the opposite conductivity types. The scope of this invention is therefore to be determined from the attached claims rather than the aforementioned detailed descriptions.

What is claimed is:

1. In a telephone ring-ground circuit that is controlled by a microprocessor, a current limiter comprising:

ring-ground switch means having one end thereof connected to a reference potential and selectively operative for completing a ring-ground circuit so as to supply a ground-start signal; said switch means comprising a first transistor having base, emitter and collector electrodes; said collector providing a ring-ground output connection when said first transistor is conducting; and a current limiting resistor interconnected between said emitter of said first transistor and said reference potential;

means for providing a voltage interface between the microprocessor and said switch means, and being responsive to a control signal from the microprocessor for operating said switch means; and non-linear circuit means connected to said switch means so as to provide a reference voltage junction directly connected to said first transistor's base and an other junction that is connected to the reference potential, said non-linear circuit means being responsive to the voltage developed between said reference potential and said first transistor's base for limiting current passed by said switch means to no more than a predetermined current value;

said interface means comprising a second transistor having base, emitter and collector electrodes; said second transistors collector being connected to said reference voltage junction; a first level shifting resistor interconnected between a control output of the microprocessor and the base of said second transistor; and a second level shifting resistor interconnected between said second transistor's emitter and a supply voltage;

said non-linear circuit means comprising a light emitting diode oriented to establish a predetermined maximum value of voltage across the series combination of said current limiting resistor and a base-emitter junction diode of said first transistor when said first transistor is conducting; said light emitting diode having a current-voltage characteristic characterized by having a sharp knee at a low voltage that defines a small current change for large increases in voltage below the predetermined voltage and a large current change for small voltage changes above said predetermined voltage level.

2. A current limiter as set forth in claim 1 wherein the resistance of said current limiting resistor is selected to provide the predetermined current in said first transistor by dividing the difference between said predetermined voltage and the normal base-emitter voltage drop of said first transistor by the predetermined current value.

3. A current limiter as set forth in claim 1 wherein said diode is a green light emitting diode.

* * * * *